(12) United States Patent
Choung et al.

(10) Patent No.: US 8,928,217 B2
(45) Date of Patent: Jan. 6, 2015

(54) ORGANIC LIGHT EMITTING DISPLAY DEVICE AND MANUFACTURING METHOD THEREOF

(71) Applicant: Samsung Display Co., Ltd., Yongin (KR)

(72) Inventors: Ji-Young Choung, Yongin (KR); Hyun-Sung Bang, Yongin (KR); Yeon-Hwa Lee, Yongin (KR); Joon-Gu Lee, Yongin (KR); Jin-Baek Choi, Yongin (KR); Won-Jong Kim, Yongin (KR); Young-Woo Song, Yongin (KR); Jong-Hyuk Lee, Yongin (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 0 days.

(21) Appl. No.: 13/840,272

(22) Filed: Mar. 15, 2013

(65) Prior Publication Data
US 2014/0034918 A1 Feb. 6, 2014

(30) Foreign Application Priority Data

Jul. 31, 2012 (KR) .................. 10-2012-0083710

(51) Int. Cl.
*H01J 1/62* (2006.01)
*H01L 51/52* (2006.01)
*H01L 51/56* (2006.01)

(52) U.S. Cl.
CPC ............ *H01L 51/5253* (2013.01); *H01L 51/56* (2013.01)
USPC .................. 313/483; 257/79; 257/98; 438/69

(58) Field of Classification Search
USPC .......................... 257/79, 98; 438/69; 313/483
See application file for complete search history.

(56) References Cited

U.S. PATENT DOCUMENTS

| 8,278,190 B2 * | 10/2012 | Karlicek et al. ............ 438/460 |
| 2005/0194896 A1 * | 9/2005 | Sugita et al. .................. 313/506 |
| 2005/0199895 A1 * | 9/2005 | Seong et al. .................... 257/94 |
| 2006/0273327 A1 * | 12/2006 | Im .................... 257/79 |
| 2007/0069635 A1 * | 3/2007 | Cok ............................. 313/504 |
| 2008/0265757 A1 | 10/2008 | Forrest et al. |
| 2010/0096660 A1 * | 4/2010 | Jeong ............................ 257/99 |

FOREIGN PATENT DOCUMENTS

| KR | 1020020022319 A | 3/2002 |
| KR | 2003-0057017 A | 7/2003 |
| KR | 10-2009-0128437 A | 12/2009 |
| KR | 10-2011-0025144 A | 3/2011 |

* cited by examiner

*Primary Examiner* — David Vu
*Assistant Examiner* — Brandon Fox
(74) *Attorney, Agent, or Firm* — Knobbe Martens Olson & Bear LLP

(57) ABSTRACT

Disclosed is an organic light emitting display device improving light efficiency by forming a metal layer having a nanometer thickness on a protective layer formed in order to protect the organic light emitting diode.

20 Claims, 6 Drawing Sheets

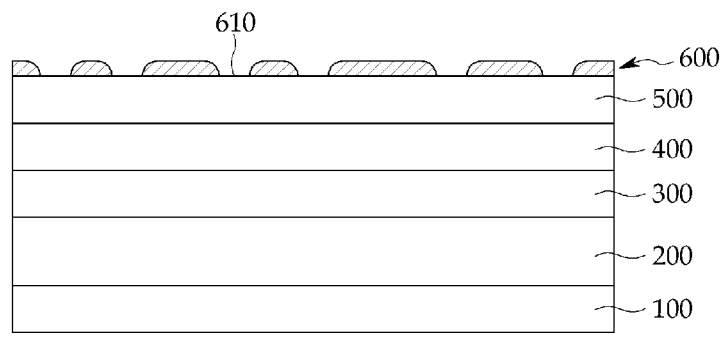
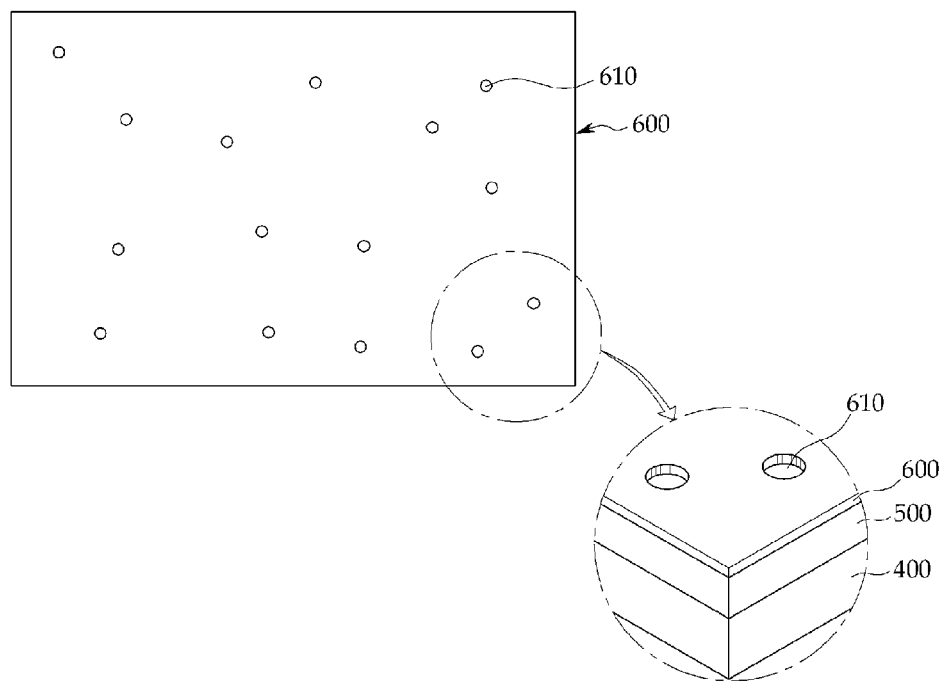

ORGANIC LIGHT EMITTING DISPLAY DEVICE AND MANUFACTURING METHOD THEREOF

CROSS-REFERENCE TO RELATED APPLICATIONS

This application is based on and claims priority from Korean Patent Application No. 10-2012-0083710, filed on Jul. 31, 2012, with the Korean Intellectual Property Office, the present disclosure of which is incorporated herein in its entirety by reference.

TECHNICAL FIELD

The present disclosure relates to an organic light emitting display device and a manufacturing method thereof, and more particularly, to an organic light emitting display device having improved light efficiency and a manufacturing method thereof.

BACKGROUND

An organic light emitting display device is a self-emission display device which has an organic light emitting diode which emits light to display an image. Since the organic light emitting display device does not require a separate light source unlike a liquid crystal display, it is possible to relatively reduce thickness and weight thereof. Further, since the organic light emitting display device has characteristics such as low power consumption, high luminance, and high response speed, the organic light emitting display device receives attention as a display device for portable apparatuses.

In general, organic light emitting display devices include a hole injection electrode, an organic emission layer, and an electron injection electrode. In the organic light emitting display device, a hole supplied from the hole injection electrode and an electron supplied from the electron injection electrode are coupled with each other in the organic emission layer to form an exciton, and light is generated when the exiton falls in a ground state.

However, in many organic light emitting display devices, external light emitting efficiency is not high. Particularly, the organic light emitting display device has a multilayer laminated structure in which a plurality of layers is laminated, and the light generated from the emission layer needs to pass through the multilayer laminated structure in order to display the light outside. While the light passes through the multi-layer laminated structure, the light generated from the emission layer is lost in the device due to total reflection and the like and as a result, a ratio of which the light is not displayed outside is high. Accordingly, in the organic light emitting display device, by reducing an amount of light lost in the inside, it is required to increase a ratio of light displayed outside and increase overall light emitting efficiency.

SUMMARY

The present disclosure has been made in an effort to provide an organic light emitting display device capable of increasing light emitting efficiency by increasing a ratio of light displayed outside. To this end, in an example embodiment of the present disclosure, it is possible to increase light emitting efficiency of an organic light emitting display device by forming a metal layer having a nanometer thickness above a protective layer formed in order to protect an internal structure such as an emission layer and an electrode.

An example embodiment of the present disclosure provides an organic light emitting display device, including: a substrate; a first electrode formed on the substrate; an organic layer including an emission layer, formed on the first electrode; a second electrode formed on the organic layer; a protective layer formed on the second electrode; and a metal layer formed on the protective layer.

A thickness of the metal layer may be in the range of 0.1 nm to 3 nm.

A plurality of holes may be formed in the metal layer. Herein, an average diameter of the hole may be in the range of 10 nm to 500 nm, and a distance between the holes may be in the range of 30 nm to 1,000 nm.

The metal layer may have a structure in which dots made of metal are dispersed on the protective layer. Herein, an average diameter of the dot made of metal may be in the range of 10 nm to 500 nm, and a distance between the dots made of metal may be in the range of 30 nm to 1,000 nm.

The metal layer may contain at least one of silver (Ag) and aluminum (Al).

The upper surface of the protective layer contacting the metal layer may be made of an organic material. The upper surface of the protective layer contacting the metal layer may be made of an inorganic material.

The organic light emitting display device may further include a window member which is separated from the protective layer, in which the protective layer and the window member may have a structure in which edge sides thereof are sealed. Here, a space between the protective layer and the window member may be filled with nitrogen (N2).

Another example embodiment of the present disclosure provides a manufacturing method of an organic light emitting display device, including: forming a first electrode on a substrate; forming an organic layer including an emission layer on the first electrode; forming a second electrode on the organic layer; forming a protective layer on the second electrode; and forming a metal layer on the protective layer.

In the forming of the metal layer, deposition using metal may be performed. The deposition may be performed so that a thickness of the metal layer is 0.1 nm to 3 nm.

In the forming of the metal layer, a material containing at least one of silver (Ag) and aluminum (Al) may be used.

In the forming of the protective layer, the uppermost layer of the protective layer may be made of an organic material, and further, the uppermost layer of the protective layer may be made of an inorganic material.

In the organic light emitting display device according to the example embodiment of the present disclosure, it is possible to increase light emitting efficiency of an organic light emitting display device by forming a metal layer having a nanometer thickness on a protective layer formed in order to protect an internal structure such as an emission layer and an electrode.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 1 is a cross-sectional view schematically illustrating a structure of an organic light emitting display device according to an example embodiment of the present disclosure.

FIG. 2 is a view exemplifying a structure of a metal layer 600 formed on a protective layer 500 in FIG. 1.

DETAILED DESCRIPTION

Figure 3:
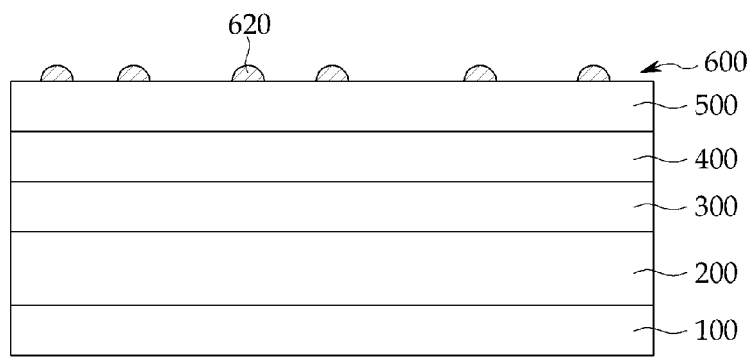
FIG. 3 is a cross-sectional view schematically illustrating a structure of an organic light emitting display device according to another example embodiment of the present disclosure.

Hereinafter, the present disclosure will be described in detail with reference to example embodiments illustrated in the drawings. The scope of the present disclosure is not limited to drawings or example embodiments to be described below. The drawings only select and illustrate an example suitable for describing the present disclosure among various example embodiments.

Respective components and shapes thereof were schematically drawn or exaggeratedly drawn in the accompanying drawings for easy understanding, and components in a real product are not illustrated and omitted. Therefore, the drawings should be analyzed in order to help understanding the present disclosure. Similar components operating the same role are designated a same reference numerals in the drawings.

Further, it will be understood that when a layer or an element is described as being "on" another layer or element, it may be directly disposed on another layer or element, or an intervening layer or element may also be present therebetween.

An example embodiment of the present disclosure, as illustrated in FIG. 1, provides an organic light emitting display device, including: a substrate 100, a first electrode 200 formed on the substrate 100, an organic layer 300 formed on the first electrode 200 and including an emission layer; a second electrode 400 formed on the organic layer 300, a protective layer 500 formed on the second electrode 400, and a metal layer 600 formed on the protective layer 500.

In the example embodiment illustrated in FIG. 1, a top emission type organic light emitting display device in which light generated from the emission layer is displayed in the second electrode 400 direction which is opposite to the substrate 100 is exemplified. The scope of the present disclosure is not limited to the top emission type organic light emitting display device, but to unify the description, hereinafter, example embodiments are described based on the top emission type organic light emitting display device.

In the organic light emitting display device, in order to protect an organic light emitting diode unit including the first electrode 200, the organic layer 300, and the second electrode 400, the protective layer 500 is formed on the second electrode. The protective layer is referred to as a capping layer to protect the organic light emitting diode unit from an external environment.

In the organic light emitting display device having the structure, when the light, which is generated from the emission layer that is disposed on the organic layer 300, passes through the protective layer 500 to be emitted outside the protective layer 500, the light is refracted or reflected due to a difference in a refractive index between media on an interface. In particular, when the difference in the refractive index on the interface is large, possibility that total reflection occurs is considerably increased. For example, when light is inputted from the protective layer 500 which is in a solid state having a refractive index of about 1.5 to a space which is in a gas state having a refractive index of about 1.0, the difference in the refractive index on the interface is increased, and as a result, possibility that total reflection occurs is large.

When the total reflection occurs on the interface while the light progresses, the light progresses along the interface and the light progressing along the interface is not emitted toward outside and thus dissipates. Accordingly, when the total reflection occurs, the light is not discharged outside but put inside to be dissipated. In the case of the organic light emitting display device, when a ratio of the light dissipated by the total reflection is large and the light which is put inside and dissipated is increased, light efficiency of the organic light emitting display device is deteriorated.

Figure 5:
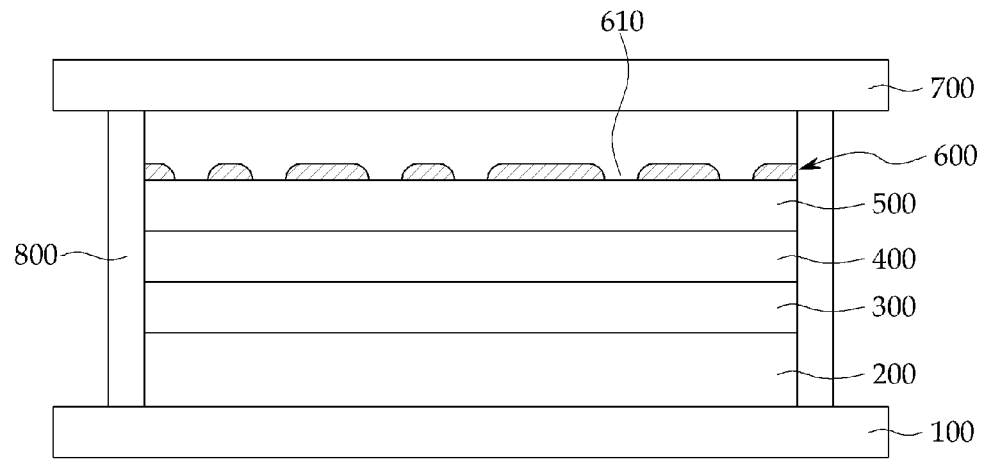
FIG. 5 is a cross-sectional view schematically illustrating an organic light emitting display device according to an example embodiment of the present disclosure in which a window member 700 is disposed.

In the organic light emitting display device, in many cases, the outside of the protective layer 500 is filled with gas. In detail, as illustrated in FIG. 5, a window member 700 is disposed above the protective layer 500, and the window member 700 is separated from the protective layer 500 and in many cases, the separated space is filled with inert gas such as nitrogen (N2). In this case, a difference in a refractive index between the protective layer 500 in a solid state and the separated space filled with gas is increased and thus possibility that the total reflection occurs on the interface is increased. As a result, possibility that the light is dissipated by the total reflection is increased.

As described above, in order to prevent the light generated from the emission layer from being totally reflected on an interface of the protective layer 500 to be dissipated, in the example embodiment of the present disclosure, as illustrated in FIG. 1 or 3, the metal layer 600 is formed on the protective layer 500.

Figure 4:
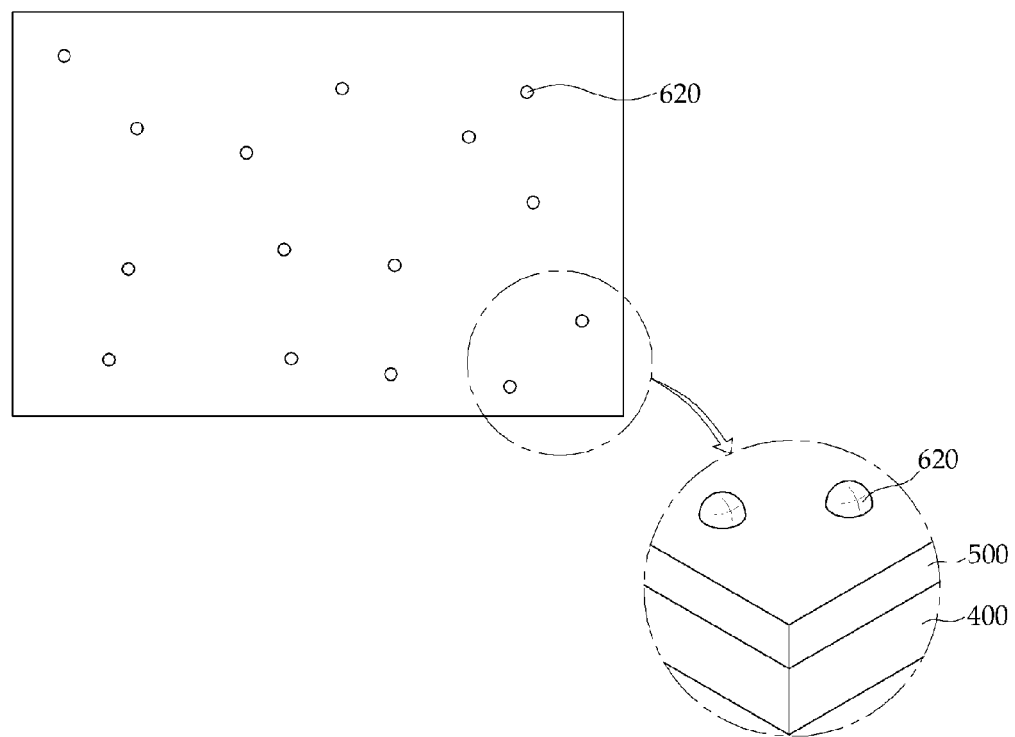
FIG. 4 is a view exemplifying a structure of a metal layer 600 formed on a protective layer 500 in FIG. 3.

The metal layer 600 is very thinly formed so as to have a thickness of about 1 Å to 30 Å, that is, 0.1 nm to 3 nm. As described above, when the metal layer 600 is thinly formed, the metal layer 600 does not cover the entire surface of the protective layer 500, and a hole is formed on the surface of the metal layer 600 (see FIG. 1), or the metal layer has a form in which dot-shaped metal drops are dispersed (see FIG. 3). FIGS. 1 and 2 are diagrams illustrating that a hole 610 is formed in the metal layer 600 formed on the protective layer 500, and FIGS. 3 and 4 are diagrams illustrating that materials for forming the metal layer coated on the protective layer 500 are agglomerated to form a nanometer-sized dot 620. In FIGS. 3 and 4, an agglomerate of the nanometer-sized dots 620 forms the metal layer 600.

As such, in the example embodiment of the present disclosure, the metal layer 600 is disposed on the protective layer 500, and the thickness of the metal layer 600 is thinly formed by about 1.0 nm to 3 nm. When the metal layer 600 is thinly formed, the metal layer does not fully cover the protective layer 500 and the hole 610 is generated in the metal layer 600, or metals forming the metal layer 600 are agglomerated to be a nanometer-sized dot 620 form to be dispersed on the surface of the protective layer 500. In this case, the hole 610 or the dot 620 may be a medium that serves to change a path of light on the surface of the protective layer 500.

In this case, a path of the light on the surface of the protective layer 500 is changed at the hole 610 or the dot 620 which is irregularly disposed on the protective layer 500. Particularly, when the light, which is totally reflected on the surface of the protective layer 500 to progress along a waveguide path formed on the surface of the protective layer, meets the hole 610 or the dot 620, the light path is changed and thus the total reflection waveguide path of the surface is deviated in some cases. As such, the deviated light may be discharged outside again. As a result, an amount of the total-reflected light is decreased, while an amount of the light discharged outside is increased.

As described above, in the example embodiment of the present disclosure, the metal layer is thinly formed on the protective layer 500 of the organic light emitting display device so that the hole 610 is generated on the metal layer or the metals forming the metal layer are agglomerated in a grain state such as the dot 620 and thus the light path is changed at the hole 610 or the dot 620, and as a result, the light trapped or to be trapped in the organic light emitting display device due to total reflection may be discharged outside.

A kind of metal forming the metal layer is not particularly limited. For example, as a material forming the metal layer, a material containing at least one of silver (Ag) and aluminum (Al) may be used.

In the example embodiment illustrated in FIGS. 1 and 3, a case where silver (Ag) is used as the metal is exemplified.

A size and a distance of the dot or hole generated in FIGS. 1 and 3 may be controlled by controlling the thickness of the metal layer 600. For example, in the case where the metal layer 600 is formed by deposition, the size and the distance of the dot or hole may be controlled during the deposition process by controlling the thickness of the deposited metal layer.

In the example embodiment illustrated in FIGS. 1 and 3, in order to improve a ratio that the light generated in the emission layer is emitted outside, the thickness of the metal layer 600 is controlled in the range of about 0.1 nm to about 3 nm. In the case where the thickness of the metal layer is too thin as less than about 0.1 nm (1 Å), the amount of the metal is too small and thus deposition is partially performed and it is difficult to form the hole or the dot. On the contrary, in the case where the thickness of the metal layer is more than about 3 nm (30 Å), the metal layer 600 compactly covers the entire surface of the protective layer 500 and thus the hole or the dot is not generated and a wide flat layer is formed.

As described above, the reason that the thickness of the metal layer 600 is in the range of 0.1 nm to 3 nm is that the hole is formed in the metal layer or the metal layer is constituted by dot-shaped particles to change the light path on the surface of the protective layer 500, and as a result, the amount of the light emitted outside the protective layer is increased.

FIG. 2 is a top view and a partially enlarged view for the metal layer 600 illustrated in FIG. 1. An average diameter of the hole 610 is in the range of about 10 nm to about 500 nm, and a distance between the holes 610 is in the range of about 30 nm to about 1,000 nm. The average diameter and the distance of the hole 610 is a range capable of being advantageous to light extraction efficiency. The average diameter and the distance of the hole 610 may be controlled by controlling the thickness of the metal layer 600 during a manufacturing process of the metal layer.

FIG. 4 is a top view and a partially enlarged view for the metal layer 600 illustrated in FIG. 3. Here, FIG. 4 illustrates a structure that the dot 620 made of a metal is dispersed on the protective layer 500 to form the metal layer 600. That is, a plurality of dots 620 dispersed on the protective layer 500 forms the metal layer 600. The metal layer in FIGS. 3 and 4 is an aggregate of the dots 620.

In FIGS. 3 and 4, the dot 620 is illustrated in a dome form as an example, but actually, various forms of dots may be formed. Further, smaller dots may be partially scattered between the dots illustrated in FIGS. 3 and 4.

An average diameter of the dot 620 made of the metal may be 10 nm to 500 nm, and a distance between the dots 620 may be average about 30 nm to about 1,000 nm. The average diameter and the distance of the dot 620 are also a range capable of being advantageous to achieve light extraction efficiency. The average diameter and the distance of the dot 620 may also be controlled by controlling the thickness of the metal layer 600 during a manufacturing process of the metal layer.

The metal layer 600 may be formed by deposition, and a deposited product may vary according to surface energy (surface tension) of the protective layer 500.

In detail, in the case where, for example, silver (Ag) as a metal is deposited so as to have a thin film thickness of about 0.1 nm to about 3 nm, silver tends to be partially deposited on the protective layer 500. In this case, when the upper surface of the protective layer 500 is made of a material having high surface energy such as an organic material, the surface energy of the organic material is higher than the surface energy of silver and thus the partially deposited silver has a tendency to be spread to cover the organic material. As a result, the silver (Ag) is widely spread on the upper surface of the protective layer 500, but does not completely cover the protective layer 500 to generate holes thereon. Accordingly, the hole 610 as illustrated in FIG. 1 is generated.

When the upper surface of the protective layer 500 on which silver is deposited is made of a material having low surface energy (surface tension) such as an inorganic material, the surface energy of the silver is higher than the surface energy of the inorganic material, and thus the silver has a tendency to be agglomerated itself. As a result, the silver forms a nanometer-sized dot 620 to obtain the metal layer 600 as illustrated in FIG. 3.

The protective layer 500 on which the metal layer 600 is formed may have a multi layer structure, and a surface contacting the metal layer 600 may be an organic layer or an inorganic layer.

The protective layer 500 is referred to as a capping layer in some cases, and is also referred to as a sealing layer. The protective layer 500 may be formed by a single layer and may be formed by a multilayer. In the case where the protective layer 500 is formed by the multilayer, the protective layer 500 has a plurality of thin film layers.

In the case where the protective layer 500 includes two or more inorganic thin film layers, the inorganic thin film layers may be the same kind of inorganic thin film layer and may be different kinds of inorganic thin film layers. Similarly, in the case where the protective layer 500 includes two or more organic thin film layers, the organic thin film layers may be the same kind of organic thin film layer and may be different kinds of organic thin film layers. Here, the same kind or different kinds represent a kind of thin film which is differentiated by a difference of a material or a laminating method of the thin film layer.

The kind of organic thin film layer depends on a difference in a characteristic of an organic material and a method of polymerizing monomers for an organic material. The organic thin film layer may be formed by using an organic thin film material which is known in the art. The organic thin film material is not particularly limited.

For example, the organic thin film layer may be completed by forming a film through a method such as evaporation, silkscreen, coating, or the like by using liquid monomers or monomers in a jell state, in which a liquid state and a solid state coexist with each other, and then photo-polymerizing the formed film by ultraviolet light or visible light. The monomers which may be applied to the above method include, for example, diazo-based, azide-based, acryl-based, polyamide-based, polyester-based, epoxide-based, polyether-based, urethane-based monomers and the like. These monomers may be used either alone or in combinations of two or more.

The organic thin film layer may be formed by a thermal polymerization method in which radicals are generated by heating the monomers and then reaction starts. The monomers which may be used herein include monomers such as polystyrene-based, acryl-based, urea-based, isocyanate-based, xylene-based resins and the like. These monomers may be used either alone or in combinations of two or more.

The organic thin film layer may be laminated by another method which is known in the art, and for example, may be laminated by an atomic layer deposition or chemical vapor deposition (CVD) method.

A thin film material and a laminating method of the inorganic thin film layer are not particularly limited so long as being known in the art.

For example, the thin film material for forming inorganic thin film layer includes silicon nitride, aluminum nitride, zirconium nitride, titanium nitride, hafnium nitride, tantalum nitride, silicon oxide, aluminum oxide, titanium oxide, zirconium oxide, magnesium oxide, titanium oxide, tin oxide, cerium oxide, silicon oxide nitride (SiON), ITO, and the like. As a deposition method thereof, a vacuum film formation method such as sputtering, chemical vapor deposition (CVD), e-beam, thermal deposition, and thermal ion beam assisted deposition (IBAD) may be used. The CVD method may include induced coupled plasma-chemical vapor deposition (ICP-CVD), capacitively coupled plasma (CCP)-CVD, surface wave plasma (SWP)-CVD methods and the like.

The protective layer 500 serves as a barrier for oxygen and moisture. The protective layer 500 may be formed in a thin type as possible due to a driving characteristic.

FIG. 5 illustrates an organic light emitting display device including a window member 700. In detail, the window member 700 is separated from the protective layer 500, and edge sides of the protective layer 500 and the window member are sealed. In detail, the window member 700 is sealed together with the substrate 100 by a sealing member 800 with the substrate 100 opposed thereto to serve to protect internal structures of the organic light emitting display device. The protective layer 500 and the window member 700 are separated from each other by a sealing method of sealing the substrate 100 and the window member 700 by the sealing member 800. The separated distance between the protective layer 500 and the window member 700 may be about several μm to dozens μm, and the separated space may be filled with a filler and may also be filled with gas. The gas which may be filled in the space is inert nitrogen ($N_2$).

Figure 6:
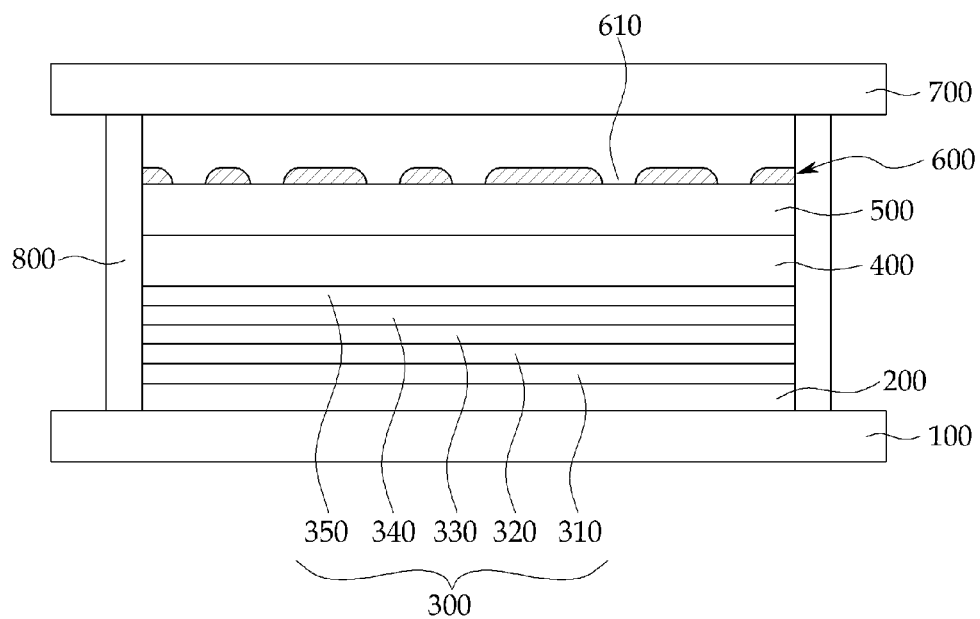
FIG. 6 is a cross-sectional view schematically illustrating a structure of an organic light emitting display device according to another example embodiment of the present disclosure.

FIG. 6 illustrates a structure of the organic layer 300 in more detail. In FIG. 6, in the case where the first electrode 200 is an anode, layers configuring the organic layer 300 include a hole injection layer 310, a hole transport layer 320, an emission layer 330, an electron transport layer 340, and an electron injection layer 350.

FIGS. 7A to 7F sequentially illustrate a manufacturing process of an organic light emitting display device according to another example embodiment of the present disclosure.

Figure 7A:
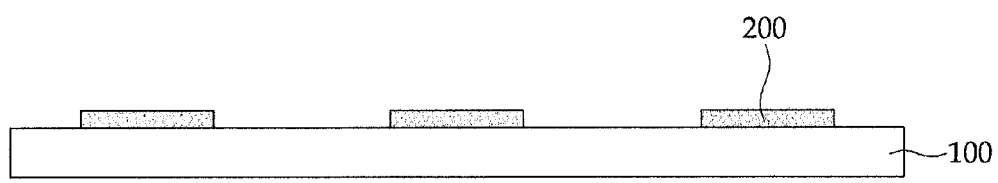
FIGS. 7A to 7F are diagrams schematically illustrating a manufacturing process of the organic light emitting display device according to another example embodiment of the present disclosure.

In order to manufacture the organic light emitting display device, first, the first electrode 200 is formed on the substrate 100 (see FIG. 7A). The substrate 100 may use glass or polymer plastic which is generally used in the organic light emitting display device. The substrate 100 may be transparent and may not be transparent.

The first substrate 200 may be provided by a transparent electrode or a reflective electrode. When being provided by the transparent electrode, the first substrate 200 may be made of ITO, IZO, ZnO or In2O3, and when being provided by the reflective electrode, the first substrate 200 may include a reflective layer made of Ag, Mg, Al, Pt, Pd, Au, Ni, Nd, Ir, Cr or a compound thereof and a layer made of ITO, IZO, ZnO or In2O3 thereon. In the manufacturing example, ITO may be used as the first substrate 200.

Figure 7B:
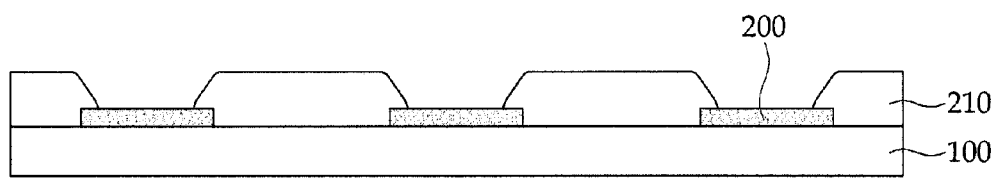

The pixel defining layer 210 is formed between the first electrodes 200 (see FIG. 7B). The pixel defining layer 210 is made of a material having an insulation property and sections the first electrode 200 by a pixel unit.

Figure 7C:
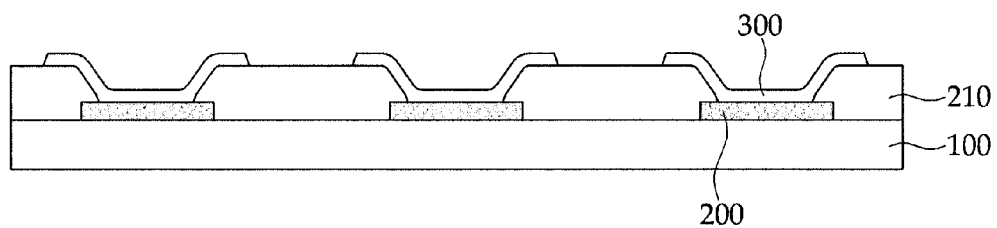

The organic layer 300 including an emission layer is formed in an opening of the first electrode 200 which is sectioned by the pixel defining layer by a pixel unit (see FIG. 7C). The organic layer 300 may further include at least one or more of a hole injection layer, a hole transport layer, an electron transport layer, and an electron injection layer, in addition to the emission layer.

Figure 7D:
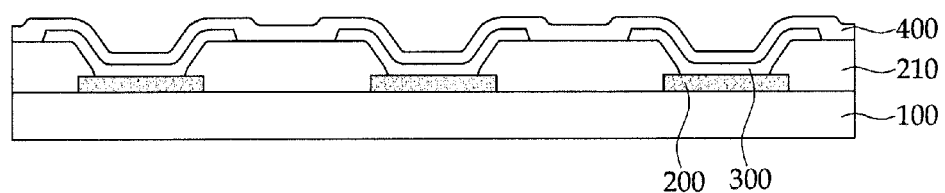

After forming the organic layer, the second electrode 400 is formed on the organic layer 300 and the pixel defining layer 210 (see FIG. 7D). The second electrode 210 may be made of a material which is generally used in the art. The second electrode 400 may also be provided by a transparent electrode or a reflective electrode. When the second electrode 400 is provided by the transparent electrode, the second electrode 400 may include a layer made of Li, Ca, LiF/Ca, LiF/Al, Al, Mg or a compound thereof and a layer made of a material for forming a transparent electrode such as ITO, IZO, ZnO, or $In_2O_3$ thereon. When the second electrode 400 is provided by the reflective electrode, the second electrode 400 may be provided by depositing Li, Ca, LiF/Ca, LiF/Al, Al, Mg or a compound thereof. In the manufacturing example, the second electrode 400 is manufactured by a transparent electrode by using, for example, LiF/Al.

Figure 7E:
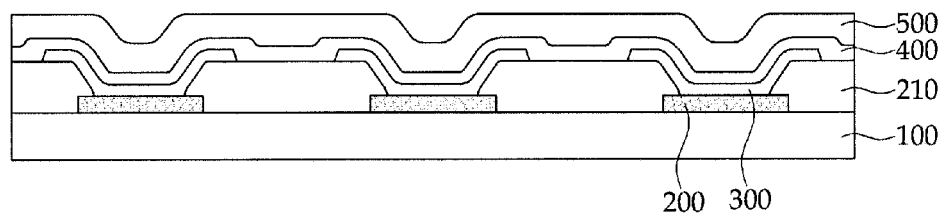

The protective layer 500 is formed on the second electrode 400 (see FIG. 7E). The protective layer 500 may be formed by a single layer and may be formed by a multilayer. Further, the protective layer may include one or more organic layers and may also include one or more inorganic layers.

In the forming of the protective layer 500, an uppermost layer of the protective layer 500 may be made of an organic material. Further, the uppermost layer of the protective layer 500 may also be made of an inorganic material. The formation of the protective layer 500 is described above.

Figure 7F:
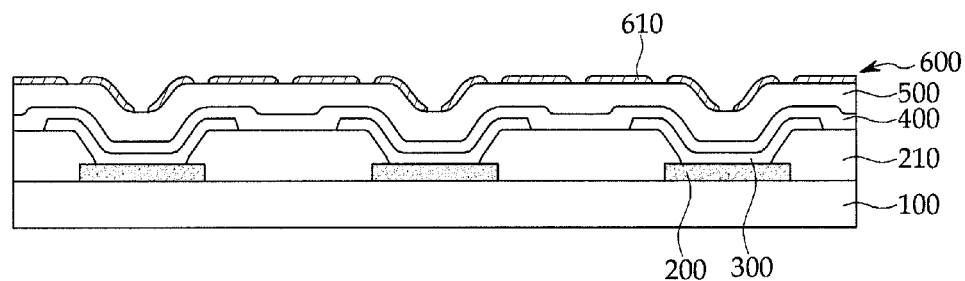

Next, the metal layer 600 is formed on the protective layer 500 (see FIG. 7F). The metal layer 600 may be formed by deposition using a metal. In this case, the deposition may be performed so that the thickness of the metal layer 600 is in the range of about 0.1 nm to about 3 nm. The metal layer 600 may be formed by using a material containing at least one of silver (Ag) and aluminum (Al). In the case where the upper surface of the protective layer 500 is made of an organic material having high surface energy, the metal layer 600 may be formed in a form illustrated in FIG. 1, and in the case where the upper surface of the protective layer 500 is made of an inorganic material having low surface energy such as ITO, the metal layer 600 may be formed in a form illustrated in FIG. 3.

Although not illustrated in the drawing, after forming the metal layer 600, forming the window member 700 may be further included. In this case, the window member 700 may be sealed together with the substrate 100 by the sealing member 800 and the like with the substrate 100 opposed thereto. As a result, as illustrated in FIG. 5, the organic light emitting display device may be obtained.

Figure 8:
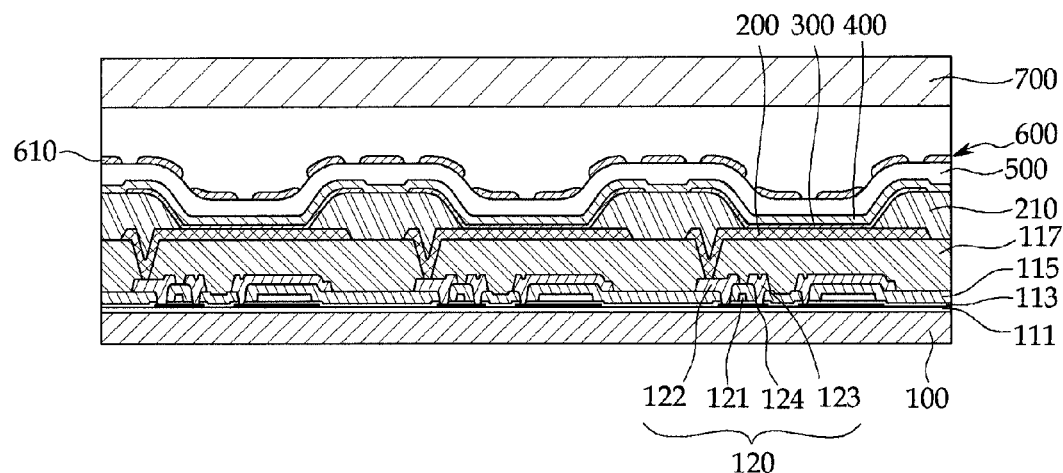
FIG. 8 is a cross-sectional view schematically illustrating the organic light emitting display device according to an example embodiment of the present disclosure, in which a substrate 100 and a lower structure are illustrated in more detail.

FIG. 8 is a cross-sectional view detailedly illustrating a part of the organic light emitting display device according to the example embodiment of the present disclosure, and particularly, exemplifies a configuration of a lower structure of the substrate 100.

Referring to FIG. 8, a plurality of thin film transistors 120 is formed on the substrate 100. An organic light emitting diode unit including the first electrode 200, the organic layer 300 and the second electrode 400 is disposed above the thin film transistors 120. Here, the first electrode 200 is an anode as a pixel electrode which is electrically connected to the thin film transistor 120, and the second electrode 400 is a cathode.

The thin film transistor 120 includes a gate electrode 121, a drain electrode 122, a source electrode 123, and a semiconductor layer 124 which are formed on the first substrate 100, and further includes a gate insulating layer 113 and an interlayer insulating layer 115. The structure of the thin film transistor 120 is not limited to the form illustrated in FIG. 8 and may be configured in another form. Further, as the thin film transistor 120, various thin film transistors such as an organic thin film transistor in which the semiconductor layer 124 is made of an organic material and a silicon thin film transistor made of silicon may be used. A buffer layer 111 made of silicon oxide or silicon nitride may be further included between the thin film transistor 120 and the first substrate 100 as necessary.

In FIG. 8, the first electrode 200 serves as an anode, and the second electrode 400 serves as a cathode, and polarities of the first electrode 200 and the second electrode 400 can be reversed.

The first electrode 200 may be provided as a transparent electrode or a reflective electrode.

The second electrode 400 may also be provided by a transparent electrode or a reflective electrode. In FIG. 8, the second electrode 400 is provided by the transparent electrode.

The pixel defining layer (PDL) 210 covers an edge of the first electrode 200. The pixel defining layer 210 serves to define a light emitting region and widen a distance between the edge of the first electrode 200 and the second electrode 400 to prevent a phenomenon that an electric field is concentrated at the edge of the first electrode 200, thereby preventing short circuits of the first electrode 200 and the second electrode 400.

The organic layer 300 including the emission layer is provided between the first electrode 200 and the second electrode 400. The organic layer 300 may be made of a low molecular organic material or a high molecular organic material.

In the case of using the low molecular organic material, a hole injection layer (HIL), a hole transport layer (HTL), an emission layer (EML), an electron transport layer (ETL), an electron injection layer (EIL) and the like may be laminated alone or in a complex structure to form the organic layer 300. As a usable organic material, copper phthalocyanine (CuPc), N,N'-Di(naphthalene-1-yl)-N,N'-diphenyl-benzidine (NPB), tris-8-hydroxyquinoline aluminum (Alq3) and the like may be variously applied. These low molecular organic materials may be applied to a method such as vacuum deposition using masks.

In the case of using the high molecular organic material, the organic layer 300 may have a structure including a hole transport layer (HTL) and an emission layer (EML), and in this case, PEDOT is used as the hole transport layer and a high molecular organic material such as poly-phenylenevinylenes (PPV) and polyfluorenes may be used as the emission layer.

The organic light emitting diode units 200, 300, and 400 are electrically connected to the thin film transistor 120 therebelow, and in this case, when a planarization layer 117 covering the thin film transistor 120 is provided, the organic light emitting diode units are disposed on the planarization layer 117, and the first electrode 200 of the organic light emitting diode units is electrically connected to the thin film transistor 120 through a contact hole which is provided in the planarization layer 117.

The protective layer 500 is formed on the second electrode, and the metal layer 600 is formed on the protective layer 500. Next, the window member 700 made of a material such as glass or plastic is sealed.

In order to verify increase in light efficiency of the organic light emitting display device according to the example embodiment of the present disclosure, a sample of an organic light emitting display device, in which an anode, an emission layer, a cathode are formed on a substrate, and a protective layer is formed thereon, is prepared. In Example, silver is deposited on the protective layer of the sample, and in Comparative Example, none is deposited, and then respective luminances are measured. The measured result is illustrated in FIG. 9.

Figure 9:
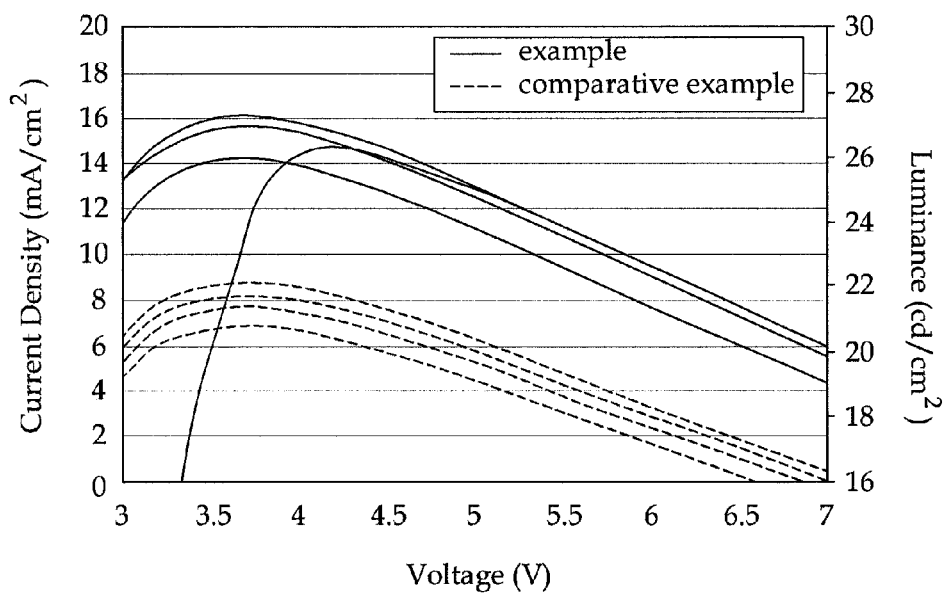
FIG. 9 is a diagram illustrating improved light emitting efficiency in the organic light emitting display device according to an example embodiment of the present disclosure.

In FIG. 9, a right Y axis is a value representing luminance. The luminance is measured many times while changing a current in the same voltage range. As illustrated in FIG. 9, it is verified that in an operation region (x axis, voltage of 3.6 to 4.1 V), luminance of the sample in the Comparative Example (dashed lines) is about 21 cd/cm2, while luminance of the sample in the Example (solid lines) to which a nanohole is applied is about 26 cd/cm2. As verified in the result, it is verified that in the case where the nanohole is formed, efficiency is improved by about 25% or more as compared with a case where the nanohole is not formed in the protective layer. The result is caused by only a difference in whether or not a nanohole thin film structure exists, while other conditions are the same.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. An organic light emitting display device, comprising:
   a substrate;
   a first electrode formed on the substrate;
   an organic layer including an emission layer, formed on the first electrode;
   a second electrode formed on the organic layer;
   a protective layer formed on the second electrode; and
   a metal layer formed on and contacting the protective layer.

2. The organic light emitting display device of claim 1, wherein a thickness of the metal layer is about 0.1 nm to about 3 nm.

3. The organic light emitting display device of claim 1, wherein a plurality of holes is formed in the metal layer.

4. The organic light emitting display device of claim 3, wherein an average diameter of the hole is about 10 nm to about 500 nm.

5. The organic light emitting display device of claim 3, wherein a distance between the holes is about 30 nm to about 1,000 nm.

6. The organic light emitting display device of claim 1, wherein the metal layer has a structure in which dots made of metal are dispersed on the protective layer.

7. The organic light emitting display device of claim 6, wherein an average diameter of the dot made of metal is about 10 nm to about 500 nm.

8. The organic light emitting display device of claim 6, wherein a distance between the dots made of metal is about 30 nm to about 1,000 nm.

9. The organic light emitting display device of claim 1, wherein the metal layer contains at least one of silver and aluminum.

10. The organic light emitting display device of claim 1, further comprising:
   a window member which is separated from the protective layer,
   wherein edge sides of the protective layer and the window member are sealed.

11. The organic light emitting display device of claim 10, wherein a space between the protective layer and the window member comprises nitrogen gas ($N_2$).

12. A manufacturing method of an organic light emitting display device, comprising:
   forming a first electrode on a substrate;
   forming an organic layer including an emission layer on the first electrode;
   forming a second electrode on the organic layer;
   forming a protective layer on the second electrode; and
   forming a metal layer contacting the protective layer.

13. The manufacturing method of an organic light emitting display device of claim 12, wherein in the forming of the metal layer, deposition using metal is performed.

14. The manufacturing method of an organic light emitting display device of claim 13, wherein the deposition is performed so that a thickness of the metal layer is about 0.1 nm to about 3 nm.

15. The manufacturing method of an organic light emitting display device of claim 12, wherein in the forming of the metal layer, a material containing at least one of silver and aluminum is used.

16. The manufacturing method of an organic light emitting display device of claim 12, further comprising forming a plurality of holes in the metal layer.

17. The manufacturing method of an organic light emitting display device of claim 16, wherein an average diameter of the hole is about 10 nm to about 500 nm.

18. The manufacturing method of an organic light emitting display device of claim 16, wherein a distance between the holes is about 30 nm to about 1,000 nm.

19. The manufacturing method of an organic light emitting display device of claim 12, further comprising forming a window member which is separated from the protective layer,
   wherein edge sides of the protective layer and the window member are sealed.

20. The manufacturing method of an organic light emitting display device of claim 19, wherein a space between the protective layer and the window member comprises nitrogen gas ($N_2$).

* * * * *